(12) United States Patent
Vogler et al.

(10) Patent No.: US 10,483,538 B2
(45) Date of Patent: *Nov. 19, 2019

(54) MIXED OXIDE CONTAINING A LITHIUM MANGANESE SPINEL AND PROCESS FOR ITS PREPARATION

(71) Applicant: Johnson Matthey PLC, London (GB)

(72) Inventors: Christian Vogler, Moosburg (DE); Gerhard Nuspl, Munich (DE); Margret Wohlfahrt-Mehrens, Illertissen (DE); Peter Axmann, Erbach (DE); Gisela Arnold, Ulm (DE)

(73) Assignee: Johnson Matthey Public Limited Company, London, England (GB)

( * ) Notice: Subject to any disclaimer, the term of this patent is extended or adjusted under 35 U.S.C. 154(b) by 256 days.

This patent is subject to a terminal disclaimer.

(21) Appl. No.: 15/397,491

(22) Filed: Jan. 3, 2017

(65) Prior Publication Data

US 2017/0179485 A1    Jun. 22, 2017

Related U.S. Application Data

(60) Continuation of application No. 14/942,237, filed on Nov. 16, 2015, now Pat. No. 9,562,303, which is a
(Continued)

(30) Foreign Application Priority Data

Jun. 24, 2008 (DE) ........................ 10 2008 029 804

(51) Int. Cl.
*C01G 45/12* (2006.01)
*H01M 4/505* (2010.01)
(Continued)

(52) U.S. Cl.
CPC .......... *H01M 4/505* (2013.01); *C01B 35/128* (2013.01); *C01G 45/1242* (2013.01);
(Continued)

(58) Field of Classification Search
None
See application file for complete search history.

(56) References Cited

U.S. PATENT DOCUMENTS 4,507,371 A    3/1985 Thackeray et al.
5,316,877 A    5/1994 Thackeray et al.
(Continued)

FOREIGN PATENT DOCUMENTS

CA    2266251 A1    9/1999
CN    1461066 A    12/2003
(Continued)

OTHER PUBLICATIONS

Cerimetrie (basierend auf U.R. Kunze, Grundlagen der quantitativen Analyse, S. 207, 2. Auflage, Thieme Verlag, Stuttgart 1986.
(Continued)

*Primary Examiner* — Lucas J. O'Donnell
(74) *Attorney, Agent, or Firm* — BakerHostetler

(57) ABSTRACT

The present invention relates to a mixed oxide containing
a) a mixed-substituted lithium manganese spinel in which some of the manganese lattice sites are occupied by lithium ions and
b) a boron-oxygen compound.

Furthermore, the present invention relates to a process for its preparation and the use of the mixed oxide as electrode material for lithium ion batteries.

25 Claims, 8 Drawing Sheets

Related U.S. Application Data division of application No. 12/999,376, filed as application No. PCT/EP2009/004512 on Jun. 23, 2009, now Pat. No. 9,281,522.

(51) Int. Cl.

| | |
|---|---|
| *C01G 51/00* | (2006.01) |
| *H01M 4/131* | (2010.01) |
| *H01M 4/62* | (2006.01) |
| *H01M 10/052* | (2010.01) |
| *C30B 1/10* | (2006.01) |
| *C30B 29/22* | (2006.01) |
| *C01B 35/12* | (2006.01) |
| *H01M 10/0525* | (2010.01) |
| *H01M 4/02* | (2006.01) |

(52) U.S. Cl.
CPC ............... *C01G 51/54* (2013.01); *C30B 1/10* (2013.01); *C30B 29/22* (2013.01); *H01M 4/131* (2013.01); *H01M 4/62* (2013.01); *H01M 10/052* (2013.01); *H01M 10/0525* (2013.01); *C01P 2002/32* (2013.01); *C01P 2002/52* (2013.01); *C01P 2002/72* (2013.01); *C01P 2004/03* (2013.01); *C01P 2004/51* (2013.01); *C01P 2004/52* (2013.01); *C01P 2004/61* (2013.01); *C01P 2006/11* (2013.01); *C01P 2006/12* (2013.01); *C01P 2006/13* (2013.01); *C01P 2006/40* (2013.01); *H01M 2004/021* (2013.01); *H01M 2004/028* (2013.01); *Y02E 60/122* (2013.01)

(56) References Cited

U.S. PATENT DOCUMENTS

| | | | |
|---|---|---|---|
| 6,080,510 | A | 6/2000 | Hemmer et al. |
| 7,217,406 | B2 | 5/2007 | Tsukuma et al. |
| 7,294,435 | B2 | 11/2007 | Miyamoto et al. |
| 7,927,741 | B2 | 4/2011 | Takeuchi et al. |
| 2001/0046628 | A1 | 11/2001 | Oesten et al. |
| 2003/0054248 | A1 | 3/2003 | Noda et al. |
| 2004/0013941 | A1 | 1/2004 | Kobayashi et al. |
| 2005/0123832 | A1 | 6/2005 | Tsukuma et al. |
| 2008/0032198 | A1 | 2/2008 | Yamaguchi et al. |
| 2010/0209771 | A1* | 8/2010 | Shizuka ................ B82Y 30/00 429/207 |

FOREIGN PATENT DOCUMENTS

| | | | |
|---|---|---|---|
| CN | 1720197 | A | 1/2006 |
| DE | 19913925 | A1 | 10/1999 |
| DE | 19935090 | A1 | 2/2001 |
| EP | 0783459 | A1 | 7/1997 |
| EP | 0993058 | A1 | 4/2000 |
| EP | 1035075 | A1 | 9/2000 |
| EP | 1136446 | A2 | 9/2001 |
| EP | 1204601 | A1 | 5/2002 |
| EP | 2214232 | A1 | 8/2010 |
| EP | 2214233 | A1 | 8/2010 |
| JP | 8195200 | | 7/1996 |
| JP | 8195200 | A | 7/1996 |
| JP | 2000294227 | A | 10/2000 |
| JP | 2001048545 | A | 2/2001 |
| JP | 2001048547 | A | 2/2001 |
| JP | 2002042812 | A | 2/2002 |
| JP | 2002170566 | A | 6/2002 |
| JP | 2002241131 | A | 8/2002 |
| JP | 2005135872 | A | 10/2003 |
| JP | 2004327305 | A | 11/2004 |
| JP | 2005112710 | A | 4/2005 |
| JP | 3972577 | | 9/2007 |
| TW | 434187 | | 5/2001 |

OTHER PUBLICATIONS

Hibino et al., "Improvement of Cycle of Life of Spinel Type of Lithium Manganese Oxide by Addition of Other Spinel Compounds During Synthesis," Solid State Ionics 2006, 177, 2653-2656.

Hollemann-Wiberg, Lehrbuch der Anorganischen Chemie, 102. Auflage de Gruyter 2007, S. 130-131.

Robertson et al., "M3+-Modified LiMn2O4 Spinel Intercalation Cathodes," J.Electrochem. Soc 114, 10, (1997), 3500-3512.

Strobel et al., "Cation Ordering in Substituted LiMn2O4 Spinels," Mat.Res.Soc. Symp. vol. Proc. 756.

Taiwanese Search Report for Application No. TW 098121121 dated Oct. 25, 2013.

European Search Report dated Jul. 14, 2011, in related European Application No. 09768968.1-1227.

International Search Report of PCT/EP2009/004512 dated Sep. 8, 2009.

\* cited by examiner

MIXED OXIDE CONTAINING A LITHIUM MANGANESE SPINEL AND PROCESS FOR ITS PREPARATION

CROSS-REFERENCE TO RELATED APPLICATIONS

This application is a continuation of U.S. application Ser. No. 14/942,237 filed on Nov. 16, 2015, which is a divisional of U.S. application Ser. No. 12/999,376 filed on May 5, 2011, which is a national phase application of PCT application no. PCT/EP2009/004512 filed on Jun. 23, 2009, which claims priority benefit of German patent application no. DE102008029804.2 filed on Jun. 24, 2008, the content of such applications being incorporated herein by reference.

FIELD OF THE INVENTION

The invention relates to a mixed oxide containing a mixed-doped lithium manganese spinel and a boron-oxygen compound as well as a process for the preparation thereof and its use, in particular as cathode material in lithium-ion secondary batteries.

BACKGROUND OF THE INVENTION

Rechargeable lithium-ion batteries are characterized by high specific energy and power. They are therefore preferably used in applications which require the smallest possible weight and little space. Thus, it is lithium-ion secondary batteries that are predominantly used today as energy stores for portable electronic devices, such as e.g. video cameras, laptop computers or mobile phones. If the production costs of rechargeable lithium batteries are further reduced, further potential applications are conceivable, such as e.g. cordless power tools, onboard power supply, traction or hybrid batteries in vehicles, or also in stationary applications, e.g. for emergency power supply equipment.

The operating principle of current lithium-ion batteries is based on the use of electrode materials which can intercalate lithium reversibly. At present, carbon compounds are customarily used as anode and a lithium-containing oxide as cathode.

In order to be able to obtain the highest possible energy densities, cathode materials which can intercalate lithium at potentials between 3 and 4 V vs. Li/Li+ are preferably used. The most promising materials which meet these requirements include lithium compounds based on cobalt, nickel, iron and manganese oxides. For reasons of cost and because they are more environmentally friendly and safer to use, manganese- and iron-based materials are currently preferred.

Of the lithium manganese oxides, compounds with spinel structure, such as e.g. $LiMn_2O_4$ (stoichiometric spinel), $Li_2Mn_4O_9$ (oxygen-rich spinel) and $Li_4Mn_5O_{12}$ (lithium-rich spinel), show the most promising properties as cathode materials. Normally, these spinels are prepared by means of solid-state reactions. This normally results in stoichiometric spinels which, however, in most cases have only an inadequate cycle life. This is attributed to changes and defects in the lattice structure which occur during the insertion and removal of lithium ions.

DESCRIPTION OF RELATED ART

In U.S. Pat. No. 4,507,371 an electrochemical cell is described in which the anode, electrolyte and cathode each have a material which has a cubic-close-packed framework structure, which has, as its basic structural unit, a unit of the formula $(B_2)X_4{}^{n-}$ and is the structural unit of an $A(B_2)X_4$ spinel. The structure accommodates active cations $M^+$ capable of diffusion within this structure. This document also describes the forms of crystal defects and stoichiometric deviations known in structural chemistry for spinel structures of the $AB_2X_4$ type, such as for example the partial replacement of B-cations by A-cations or the lack or excess of X-anions, and teaches that these can exert an influence, not quantified in more detail, on the electrochemical properties.

U.S. Pat. No. 5,316,877 describes spinel compounds of the general formula $Li_1D_{x/b}Mn_{2-x}O_{4+\delta}$ with $0 \leq x < 0.33$; $0 \leq \delta < 0.5$; wherein D is preferably Li, Mg, Co, and b is the oxidation state of this cation. The described embodiment examples are limited to the case where D=Li. The preparation is by means of a solid-state process in which $LiNO_3$, or $LiOH$ is mixed with $\gamma$-$MnO_2$ in the desired molar ratio together with hexane in a ball mill. Then the mixture is fired in air for 48 h at 450° C. and fired for a further 48 h at 750° C.

In EP 0 783 459 B1 doped lithium complex oxides of the general formula $Li_yMe_xMn_{2-x}O_4$ are described which have a spinel-type crystalline structure and are suitable as cathode material in lithium secondary batteries. The batteries produced with these cathodes are said to have a long cycle life. The lithium manganese spinel is prepared by reacting quantities, corresponding to the stoichiometry of the spinel to be prepared, of the reaction components in the form of hydroxides and/or water-soluble metal salts in dissolved form in a basic aqueous medium accompanied by formation of a homogeneous suspension. The dried reaction products are then heated to temperatures of between 500 and 900° C. at a heating rate of 1-20 K/min, wherein the respective mixed oxides form in radiographically phase-pure form. Particularly suitable metal cations Me are iron, titanium and aluminium, as well as cobalt and nickel. Complex oxides of the formulae $LiFe_{0.1}Mn_{1.9}O_4$, $LiTi_{0.1}Mn_{1.9}O_4$ and $LiNi_{0.1}Mn_{1.5}O_4$ are disclosed in the examples. The patent teaches that a uniform fine distribution of the starting components is important for the preparation of phase-pure doped lithium manganese spinels and that this fine distribution is achieved particularly advantageously by the joint precipitation of the starting components from a solution.

In EP 1 035 075 A1, a two-stage precipitation and suspension process for the preparation of a complex lithium manganese spinel doped inter alia with boron is described. The compound has the following general formula:

$$Li_xMn_{(2-y)}M_{y1}B_{y2}O_4,$$

wherein M is selected from the group of Al, Cr, Fe, Ni, Co, Ga and Mg, and furthermore: $0.9 \leq x \leq 1.1$; $y=y_1+y_2$, wherein $0.002 \leq y \leq 0.5$ and $0 \leq y_1 < 0.5$ and $0.002 \leq y_2 \leq 0.1$. The doping element boron is added in the second process step because of its ready solubility and inserted in the lattice sites of the manganese.

Robertson et al. (J. Electrochem. Soc. 144, 10, (1997), 3500-3512) report enlarged crystallites (about 1 μm) and a reduced specific surface area according to BET (<1 m²/g) for a boron-doped spinel of the composition . The associated scanning electron microscopy image shows large octahedral crystallites with rounded corners and edges with indicated crystal surfaces. However, very poor electrochemical properties are also reported for this material. Thus, a specific capacity of less than 50 mAh/g was measured, which also decreases markedly from cycle to cycle.

In EP 1 204 601 B1, lithium manganese spinels for thin-film electrodes are described. In the process of EP 1 204 601 B1, the obtained lithium manganese spinel is sintered in the form of agglomerates in oxidizing atmosphere at 450° C. to 900° C., wherein 0.1 to 3% boron oxide or boric acid, relative to the weight of the solids used, can be added as sintering auxiliary, in order to achieve a higher strength of the agglomerates. No effect of the boron compounds on the crystallinity of the spinel is described.

In EP 0 993 058 A1, a lithium secondary battery is described, the positive electrode active material of which is composed mainly of lithium and manganese and has a cubic spinel structure. In a comparison example, $LiMn_2O_4$ doped with boron is used as electrode material. This electrode material is prepared by mixing powdery $Li_2CO_3$, $MnO_2$ and $B_2O_3$ in the molar ratio Li:Mn B=1:2:0.03 and calcining the obtained mixture in an oxidizing atmosphere for twenty-four hours at 800° C. Particles are obtained which have a deformed octahedral shape with flat crystal faces, wherein the edges and corners of the crystals are rounded.

In JP 2001-48545, a process for the preparation of a complex boron-doped lithium manganese oxide with spinel structure is described, wherein a lithium compound and a manganese compound are reacted in liquid phase in the presence of a boron compound. The doping element aluminium is introduced in the form of a solid compound. Roughly spherical granulated particles with an average particle diameter of 15 μm are obtained.

EP 1 136 446 A2 discloses coated lithium complex oxide particles and a method for their preparation. The coating, which can be formed as a single or as several identical or different layers, is said to improve the properties of electrochemical cells in which a cathode consists of the coated lithium manganese oxide material according to the invention. Although doping with additional lithium (hyperstoichiometric lithium) is described in the overall disclosure, it is not explicitly disclosed. Typical coatings are obtained with alkali borates and boron lithium complex salts.

P. Strobel et al. describe, in "Cation Ordering in Substituted $LiMn_2O_4$ Spinels", Mat. Res. Soc. Symp. Vol. Proc. 756, the effect of different trivalent and divalent metal cations as doping agents which occupy the 16d manganese lattice sites on the electronic properties of such doped lithium manganese spinels. In particular, the replacement of precisely a quarter of the octahedral cations (16 e) was attempted here and it was shown that, for magnesium and zinc, this resulted in a superstructure with a primitive cubic symmetry. In the case of zinc, a further lattice distortion was detected at the tetrahedral 8a site by FTIR spectroscopy.

DE 199 13 925 A1 discloses hyperstoichiometric lithium manganese spinels. The lithium manganese spinels in this patent application conform to the general formula Li($Mn_{2-x}Li_x$)$O_4$, wherein x is 0<x≤0.8, which can be obtained by a spray pyrolysis process. Lithium is inserted instead of manganese in its 16d lattice sites, but the lithium doping is limited to the range 0<x≤0.05, since outside of this range the cycle characteristic of cathodes containing this material deteriorates, because of the Jahn-Teller effect, compared to the unsubstituted lithium manganese spinels.

U.S. Pat. No. 7,217,406 describes granular particles of a lithium-manganese oxide for use as material in secondary batteries, in which boron, in particular $H_3BO_3$, is added as so-called "fluxing agent". Boron is inserted instead of manganese in its lattice sites.

Buhrmester's doctoral thesis (Darmstadt 2001) deals with the defect structure in the $Li_{1+x}Mn_{2-y}O_{4-\Delta}$ system and describes the structural and electronic behaviour of lithium manganese spinels hyperstoichiometrically doped with lithium.

Lithium secondary batteries are also increasingly used for applications in which a long cycle life, a high current carrying capacity and a high safety in the event of misuse or malfunction are required. Such requirements must be satisfied for example for storage batteries in hybrid vehicles which have an electric motor in addition to a normal combustion engine. In addition, such batteries must also be cheap to produce. The production costs are influenced by all components of the batteries.

DESCRIPTION OF THE INVENTION

An object of the invention was therefore to provide material, in particular a material containing a lithium manganese spinel, which can be used as electrode material in particular in secondary lithium-ion batteries and which has good charging characteristics.

This object is achieved by a mixed oxide containing
a) a mixed-substituted lithium manganese spinel in which some of the manganese lattice sites are occupied by lithium ions and
b) a boron-oxygen compound.

Surprisingly, it was found that the mixed oxide according to the invention has improved electrochemical properties compared with a non-doped lithium manganese spinel or one doped with foreign atoms such as Zn, Mg, Cu, Al (mixed-substituted), but also compared with a lithium manganese spinel only hyperstoichiometrically doped with lithium or such a spinel which is doped with further foreign atoms.

The term "some" is explained in more detail in the following Formula I by the numerical value for the index c.

The term "mixed oxide" describes according to the invention a single-phase homeotype mixed crystal comprising the two constituents (e.g. Hollemann-Wiberg, Lehrbuch der Anorganischen Chemie, $102^{nd}$ edition, de Gruyter 2007, pp. 130-131) and serves to illustrate that the boron of the boron-oxygen compound is not a doping element for the 16 d manganese lattice sites in the lithium manganese spinel and does not occupy these sites. In this case, the compound would be a so-called "complex" oxide.

The term "mixed-substituted" means that, in addition to (hyperstoichiometric) lithium, at least one further metal, other than manganese, is located on the 16 d lattice sites of the manganese.

Constituent a) of the mixed oxide according to the invention, the lithium manganese spinel, is typically also described as so-called "hyperstoichiometric" lithium manganese spinel.

In particular, the single-phase mixed oxide according to the invention has a smaller BET surface area than comparable lithium manganese spinels doped with lithium and/or with metals or transition metals or pure lithium manganese spinels, namely a BET surface area of <4 $m^2$/g, preferably <2 $m^2$/g and more preferably of <1 $m^2$/g and most preferably <0.5 $m^2$/g, whereby the manganese dissolution in the electrolyte of a corresponding cell is clearly reduced, since the BET surface area is correlated with the manganese dissolution in the electrolyte.

The resistance to a dissolution in the electrolyte is thus increased by the mixed oxide according to the invention, i.e. in particular thus by the presence of the boron-oxygen bond (see below).

In addition, for the mixed oxide according to the invention, very narrow reflex widths in X-ray diffraction spectra are obtained, since according to the invention very large crystallites of the mixed oxide are surprisingly obtained. The large crystallites lead to a reduced surface area of the mixed oxide, whereby the dissolution in the electrolyte is further reduced and the tap density (or, in other words, compression) is also increased. In comparison with a pure lithium manganese spinel (LiMn$_2$O$_4$), an improvement in the tap density from 1.23 g/cm$^3$ to 2.03 g/cm$^3$ is observed for the mixed oxide according to the invention. By the term "tap density" is meant in the present case the compression of the powder through exposure to the action of an external pressing force ("packing force") of a sample of the respective material, starting from an original bulk volume $V_o$ of the sample. The external pressing force acts on a container filled with a predetermined quantity of the sample, which then repeatedly strikes a flat surface (see e.g. www.particletesting/com/-density.aspx).

Moreover, the presence of the boron-oxygen compound in the mixed oxide according to the invention surprisingly ensures a clearly increased homogeneity of the insertion of the transition metal in the lithium manganese spinel compared with a doping without the presence of a boron-oxygen compound, with the result that in particular a homogeneous uniform insertion of for example aluminium, zinc, etc. in the 16 d manganese lattice sites takes place. This likewise leads to clearly improved electrochemical properties.

Within the framework of the present invention, an improvement of up to approx. 20% in the cycle stability was recorded in an electrode containing the mixed oxide according to the invention compared with an electrode containing only pure doped or undoped lithium manganese spinel.

As already briefly stated above, in the lithium manganese spinel of the mixed oxide, further manganese lattice sites (16 d position) are preferably occupied or substituted by at least one metal ion, selected from the group consisting of Al, Mg, Zn, Co, Ni, Cu and Cr or mixtures thereof, with the result that a wide variety of mixed-substituted hyperstoichiometric lithium manganese spinels can be made available in the mixed oxide according to the invention which in particular can also be optimized with regard to cycle stability. As already stated, the presence of the boron-oxygen compound leads to an extremely homogeneous insertion of these metals in the manganese lattice sites.

Some of the lithium ions on the 8a tetrahedral sites are further substituted by a metal ion selected from the group consisting of Zn, Mg and Cu, whereby the electrochemical properties of the mixed oxide according to the invention can be adjusted still more precisely.

Preferably, the boron-oxygen compound in the mixed oxide according to the invention is a boron oxide or a boric acid, quite particularly preferably B$_2$O$_3$ or H$_3$BO$_3$. Further representatives of these classes of compound that can be used according to the invention are (BO)$_x$, BO, B$_2$O, as well as H$_2$BO$_2$ and HBO. In likewise preferred developments of the present invention, borates, i.e. the salts of orthoboric acid (H$_3$BO$_3$) and metaboric acid (H$_2$BO$_2$), preferably monoborates, can also be used. In less preferred embodiments, oligo- and polyborates can also be used. Alkali metal metaborates M$_2$BO$_2$, in particular Li$_2$BO$_2$, are quite particularly preferred. Reference is made in individual cases to Hollemann-Wiberg, Lehrbuch der Anorganischen Chemie, de Gruyter, Berlin 102$^{nd}$ edition, 2007, pp. 1104-1110 with regard to the structure and chemistry of the boron-oxygen compounds.

Surprisingly, it was found that the mixed oxide according to the invention has the advantages summarized as follows compared with pure doped or non-doped lithium manganese spinels without the presence of boron-oxygen compounds:

The mixed oxide according to the invention has a greatly reduced BET surface area of <0.5 m$^2$/g, wherein the BET surface area correlates with the manganese dissolution in the electrolyte.

The mixed oxide according to the invention has an increased tap density (increase from 1.23 g/cm$^3$ to 2.03 g/cm$^3$).

The mixed oxide according to the invention has narrow reflex widths in the XRD spectrum and large crystallites.

The homogeneity of the insertion of the doping metal in the spinel of the mixed oxide is clearly improved compared with doped lithium manganese spinel of the state of the art.

Electrochemically, an improvement in the cycle stability of the mixed oxide according to the invention was recorded compared with doped lithium manganese spinel of the state of the art.

The lithium manganese spinel of the mixed oxide contains, as already stated above, the lithium on some of the manganese lattice sites (hyperstoichiometry). The doping metal ions are distributed uniformly in the crystal. This is shown for example by the oxidation state of the manganese and by the X-ray diffraction spectrum (see examples below).

Furthermore, it was also found that as the quantity of boron-oxygen compound in the mixed oxide increases, the quantity of lithium in the mixed oxide according to the invention must also be increased in order to be able to prepare electrodes with electrochemically particularly advantageous properties. Thus, additional Li must be added in the molar ratio f=Li/B of 1 up to 4 to 1. Preferably, this ratio is 1 up to 3 to 1 and particularly preferably 1.5 up to 3 to 1.

The general formula of the mixed oxide according to the invention can be expressed as follows:

$$[(Li_{1-a}M_a)(Mn_{2-c-d}Li_cN_d)O_x] \cdot b(B_zO_yH_uX_v) \quad (I)$$

wherein:
  0≤a<0.1;
  d<1.2;
  3.5<x<4.5;
  0.01<c<0.06;
    z=1, 2 or 4;
    y=1, 2, 3 or 7;
    u=0, 1, 2 or 3;
    v=0, 1, 2 or 3;
  0.01<b<0.5;
  M is at least one element from the group of Zn, Mg and Cu;
  N is at least one element from the group of Al, Mg, Co, Ni, Cu and Cr;
  X is at least one element from the group Li, Na, K.

In quite particularly preferred developments, the above-named formula can be expressed as follows:

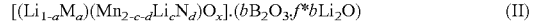

$$[(Li_{1-a}M_a)(Mn_{2-c-d}Li_cN_d)O_x] \cdot (bB_2O_3 \cdot f^*bLi_2O) \quad (II)$$

wherein:
  0≤a<0.1;
  d<1.2;
  3.5<x<4.5;
  0.01<c<0.06;
  0<b<0.05;
  1<f<4;
  M is at least one element from the group of Zn, Mg and Cu;
  N is at least one element from the group of Al, Mg, Co, Ni, Cu and Cr.

The quantity of boron-oxygen compound in the mixed oxide is chosen such that the above-defined formula coefficient b is between 0.01 and 0.05, preferably between 0.01 and 0.05, quite particularly preferably between 0.0025 and 0.025 and even more preferably between 0.005 and 0.0025. A coefficient of b=0.001 corresponds to approximately 0.5% by weight of boron-oxygen compound in the mixed oxide containing lithium manganese spinel.

As already explained above, the lithium manganese spinel of the mixed oxide according to the invention has a very uniform distribution of the doping elements N in the crystal lattice. Furthermore, the mixed oxide according to the invention has a very high phase purity, which is also reflected in the X-ray diffraction spectrum. Preferably, the mixed oxide according to the invention has, in an X-ray diffractogram at a diffraction angle of 2 θ in the range from 63.5 to 65°, a signal in which the ratio of the line widths $B_{10}$ measured at 10% of the signal height to the line width $B_{50}$ measured at 50% of the signal height is less than 2.0, preferably less than 1.8. In particular, the diffraction signal has no shoulder, which indicates a high phase purity (see also FIGS. 1 and 5).

The hyperstoichiometric lithium is, as already stated, inserted in the lithium manganese spinel according to the invention on lattice sites of the manganese. This is shown by the degree of oxidation of the manganese. Preferably, the manganese of the spinel in the mixed oxide according to the invention has a degree of oxidation, defined by cerimetry, in the range from 3.60 to 3.69.

The mixed oxide according to the invention has comparatively large particles, wherein the lithium manganese spinel contained in the mixed oxide has few defects. This advantageously results in a small BET surface area. Preferably, the mixed oxide according to the invention has a BET surface area, determined according to DIN 66132, of less than 4 $m^2/g$.

The mixed oxide according to the invention has a relatively high particle size. Preferably, the size of the primary crystallites is at least 0.5 μm, preferably <1 μm, most preferably in the range between 1 and 3 μm. The size of the primary crystallites can be determined under the electron microscope. (see also FIG. 4)

A level of doping elements N in which the value for d lies in the range from 0.05 to 0.2 is preferred. A value for d in the range between 0.08 and 0.15 is particularly preferred. Preferably, aluminium is used as doping element N of the mixed oxide according to the invention. Alternatively, magnesium is a further preferred doping element N, or mixtures of aluminium and magnesium.

So-called high-voltage spinels very strongly doped with Co and Ni for which d in the case of Co is preferably 1±0.2 and in the case of nickel 0.5±0.1 occupy a special position.

A level of doping elements M which corresponds to a value of a of 0.005 to 0.02 is preferred. A particularly preferred doping element M is zinc.

The mixed oxide according to the invention is very suitable as electrode material for the production of secondary lithium batteries. A subject of the invention is therefore also an electrode, comprising an electrically conductive support to which the mixed oxide according to the invention is applied.

A further object of the invention was to provide a process for the preparation of mixed oxides containing a doped or non-doped lithium manganese spinel which can be carried out economically and with which a mixed oxide containing lithium manganese spinel can be obtained which can be used as electrode material in high-performance lithium secondary batteries.

This object is achieved by a process for the preparation of a mixed oxide containing a mixed-doped hyperstoichiometric lithium manganese spinel, wherein at least a lithium component, a manganese component, a boron-oxygen component, a component containing N, wherein N is selected from the group of Al, Mg, Co, Ni, Cu and Cr, and/or a component containing M, wherein M is selected from Zn, Mg and Cu is provided;

a first portion of a solid mixture is prepared by mixing some of the components in dry, powdery form;

a second portion of a liquid mixture is prepared which contains a portion of the components in dissolved form and/or as a suspension, wherein the stoichiometric quantities of the components of the first and second portions are selected such that a mixed oxide of the following formula results:

$$[(Li_{1-a}M_a)(Mn_{2-c-d}Li_cN_d)O_x] \cdot b(B_zO_yH_uX_v)$$

wherein:
0≤a<0.1;
d<1.2;
3.5<x<4.5;
0.01<c<0.06;
z=1, 2 or 4;
y=1, 2, 3 or 7;
u=0, 1, 2 or 3;
v=0, 1, 2 or 3;
0.01<b<0.5;
M is at least one element from the group of Zn, Mg and Cu;
N is at least one element from the group of Al, Mg, Co, Ni, Cu and Cr;
X is at least one element from the group Li, Na, K;
(It is understood that a mixed oxide according to Formula II can of course also be obtained by a suitable choice of the quantities of starting materials)
the first and second portions of the mixture are mixed;
the solvent is drawn off from the mixture obtained,
the mixture is calcined at a temperature of more than 300° C.

With the process according to the invention for the preparation of a mixed oxide containing a doped hyperstoichiometric lithium manganese spinel and a boron-oxygen compound, initially at least one compound each of the elements Li, Mn and boron (here, of course, a boron-oxygen compound) and a compound of a metal N, wherein N is selected from the group of Al, Mg, Co, Ni, Cu and Cr and/or a compound of a metal M, wherein M is selected from Zn, Mg and Cu, are prepared. The starting components, preferably the lithium or the boron-oxygen component, can be prepared in solid form. The boron-oxygen component is one of the boron-oxygen compounds described above.

The solid components are preferably used in pre-ground form. In the experiments it was shown that the particle morphology of the mixed oxide can be controlled in a targeted manner through the particle morphology of a solid and undissolved manganese compound used. In a particularly preferred embodiment, therefore, a solid and insoluble manganese compound is used which has previously been brought to the desired particle size, which is defined by laser granulometry, of the end-product. The essential aim is to limit the so-called oversize particle which causes problems during the processing into thin-film electrodes. The D95 value of a solid manganese compound used should therefore lie below 60 μm, preferably below 30 μm. The method of determination will be discussed below.

The compounds are preferably each provided in the form of a metal compound (thus as a so-called binary compound in which, however, several anions can also be present, but only one (metal) cation), since this allows problem-free doping. However, it is also possible to use compounds which contain several of the metals, thus so-called polynary compounds with several different (metal) cations.

At least one starting component, namely preferably that of a chemically inert doping element such as aluminium, magnesium, zinc, cobalt or nickel, is provided in dissolved form in order to guarantee the fine distribution in the later process steps. The solvent is preferably water.

The quantity of solvent is chosen such that the components to be dissolved can be completely dissolved. Since the solvent must be removed again in a later process step, the chosen quantity of solvent is, however, as small as possible. The chosen quantity of solvent should, however, be large enough for it to be able to take up the solid components in the form of a suspension or paste. All of the starting components can also be used in dissolved form in order to create ideal conditions for their fine distribution in the later process steps. However, because of the greater solvent requirement and because of the limitations on the selection of raw materials, this is a less preferred embodiment.

The solid and dissolved components used for the preparation of the mixed oxide containing lithium manganese spinel are preferably provided in the form of their nitrates, acetates, oxides, hydroxides or carbonates. These compounds are, in some cases, very readily soluble in water.

The soluble manganese component is preferably selected from manganese nitrate and manganese acetate.

The solid manganese component is preferably selected from manganese carbonate, manganese oxide and manganese dioxide.

The boron component is preferably selected from a boric acid, an alkali borate and a boron oxide. Typical representatives of boric acid are $H_3BO_3$, $H_3BO_2$, and of oxides $B_2O_3$, $(BO)_x$, $BO_2$. Boric acid $H_3BO_3$ and boron oxide $B_2O_3$ and also lithium or sodium borates are quite particularly preferred.

The named manganese and boron components can be used on their own or in a mixture.

The stoichiometric quantities of the components are selected such that they are present in a molar ratio which corresponds to a mixed oxide comprising a doped lithium-manganese spinel and a boron-oxygen compound of the following formula:

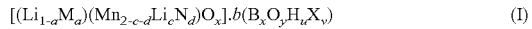

$$[(Li_{1-a}M_a)(Mn_{2-c-d}Li_cN_d)O_x] \cdot b(B_xO_yH_uX_v) \qquad (I)$$

wherein:
0≤a<0.1;
d<1.2;
3.5<x<4.5;
0.01<c<0.06;
z=1, 2 or 4;
y=1, 2, 3 or 7;
u=0, 1, 2 or 3;
v=0, 1, 2 or 3;
0.01<b<0.5;
M is at least one element from the group of Zn, Mg and Cu;
N is at least one element from the group of Al, Mg, Co, Ni, Cu and Cr;
X is at least one element from the group Li, Na, K.

In quite particularly preferred developments, the above-named formula can be expressed as follows:

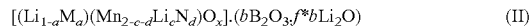

$$[(Li_{1-a}M_a)(Mn_{2-c-d}Li_cN_d)O_x] \cdot (bB_2O_3 \cdot f^* bLi_2O) \qquad (II)$$

wherein:
0≤a<0.1;
d<1.2;
3.5<x<4.5;
0.01<c<0.06;
0<b<0.05;
1<f<4;
M is at least one element from the group of Zn, Mg and Cu;
N is at least one element from the group of Al, Mg, Co, Ni, Cu and Cr.

The components are then mixed, wherein the mixing can be carried out in any order. In a procedure preferred on process engineering grounds, the liquid partial mixture is introduced first and the solid powdery partial mixture added under stirring, wherein a suspension or paste is obtained. It is possible that a particular element is represented either only in the solid portion or only in the liquid portion. However, a particular element can also be distributed over both portions. Thus, it can be advantageous that the manganese portion is added both as a solid compound and as a dissolved compound, in order to both control the particle morphology of the end-product and promote the homogeneous distribution of the chemically inert doping elements. The mixture can be prepared in a normal mixer.

The mixing conditions are such that essentially no further reduction of the insoluble solid components occurs. The components can be mixed at temperatures of 0° to 100° C., but preferably between room temperature and 50° C. Depending on the mixing intensity of the mixing unit used, the mixing is carried out over a period of a few minutes to several hours. The mixing process preferably proceeds under chemical conditions in which compounds of the dissolved chemically inert elements are precipitated. This can take place for example by altering the pH value through one of the added components or by reacting two dissolved components or one dissolved and one solid component with each other. However, it is also possible not to precipitate the dissolved chemically inert components until the subsequent drying, which is, however, less advantageous for their uniform, fine distribution.

When the mixing is concluded, the solvent is drawn off from the mixture. Any process can be used per se. For example, the solvent can be removed by freeze-drying or spray-drying. The solvent can also be removed by heating the mixing container after the mixing and distilling off the solvent under stirring. The mixture assumes a doughy consistency, with the result that, as far as possible, measures are taken to prevent the mixture sticking to the mixer or on the walls of the mixing container. At the end of the drying process, the mixture can for example also be placed in a furnace and remaining solvent expelled at increased temperature there. The temperatures are chosen such that the evaporation of the solvent is as uniform as possible. Preferably, the drying occurs at temperatures of less than 300° C.

When the solvent has been removed, the mixture is calcined in air at temperatures of 300° C. to 800° C. The calcining is preferably carried out in two stages. The first stage is carried out at a holding temperature between 300° C. and 600° C. and for a period of 10 min. to 2 hours and serves to expel gaseous decomposition products and form a still little-crystallized and immature spinel compound.

The second stage is carried out as a tempering stage at a holding temperature between 600° C. and 800° C., preferably between 740° C. and 780° C., and for a period of 1 to 12 hours and serves to mature the spinel compound. The heating rate is as desired, the cooling rate is preferably between 0.5 K/min. and 5 K/min. The two temperature treatments can directly succeed each other or alternatively be interrupted by an intermediate cooling step and a reduction treatment.

To form a phase-pure and homogeneously doped mixed oxide comprising a lithium manganese spinel and a boron-oxygen compound with improved electrochemical properties, a fine homogeneous distribution of the chemically inert doping components in the precursor mixture is needed. With the process according to the invention, this is guaranteed by joint precipitation of these components from the dissolved state.

An expensive and energy-consuming high-energy grinding, e.g. in a ball mill, can thereby be dispensed with for example unlike with doped, in particular boron-doped, aluminium manganese spinels of the state of the art. Moreover, such a process brings with it the risk of contamination by the rubbings from the grinding tools.

Furthermore, the dissolved and precipitated components are uniformly distributed in the mixture and are thus also uniformly inserted in the spinel, without excessively high temperatures also having to be used over an extended period for the thermal treatment of the mixture, as is the case for example with pure solid-state processes. This increases the profitability of the process through lower energy costs and a larger throughput and reduces the losses of volatile lithium during the thermal treatment. However, a precipitation process followed by temperature treatment at a reduced holding temperature and holding time has the disadvantage of small crystallite sizes and a large specific surface area. This increases the attack surface vis-à-vis aggressive electrolyte constituents.

In order to counter this unfavourable effect, the invention therefore provides for an extra addition of a boron-oxygen compound, with the result that a phase-pure mixed oxide forms. Surprisingly, however, it was shown that the addition of the boron-oxygen compound in the process according to the invention not only promotes the growth of the crystallites but also, as already stated above, the homogeneous distribution of the remaining doping elements. The distribution, qualifiable by evaluation of the powder X-ray diffraction profiles of the end-product in the spinel structure, of the doping elements is completely homogeneous in the process according to the invention both when using exclusively dissolved starting components and when predominantly using solid starting components, as long as a boron-oxygen compound is also added.

Surprisingly, the process according to the invention leads to a phase-pure mixed oxide in which boron—as already stated above—does not occupy lattice sites of the manganese ("doping" or "substitution"), but is present as a boron-oxygen compound in the same phase as the doped lithium manganese spinel. This effect was previously unknown.

Through the process according to the invention and the formation of mixed oxide, it is possible to prepare X-ray graphically phase-pure and homogeneously doped lithium manganese spinels, without complete dissolution and precipitation of the starting components, without high-energy grinding and without very long temperature treatments at high temperature. The process is thereby very economical. In addition, no wastewater and no waste and co-products accumulate.

Moreover, it was surprisingly shown that an increase in boron addition necessitates a matching increase in the lithium excess (hyperstoichiometry) in order to compensate for negative concomitant effects.

With the process according to the invention, the mixed oxides according to the invention containing doped lithium manganese spinels and a boron-oxygen compound can thus be prepared which have a comparatively large crystallite size and a small BET surface area. The doping agents, the metals of the groups formed by N and M, are uniformly distributed in the spinels on the manganese lattice sites in the spinel. Very uniform crystallites are obtained which have few lattice defects.

A further subject of the invention is a secondary battery, in particular a rechargeable secondary battery, which comprises an electrode containing the mixed oxide according to the invention as electrode material ("active material"), in particular cathode material.

The invention is described in more detail using examples and referring to the attached figures.

GENERAL

Figure 1:
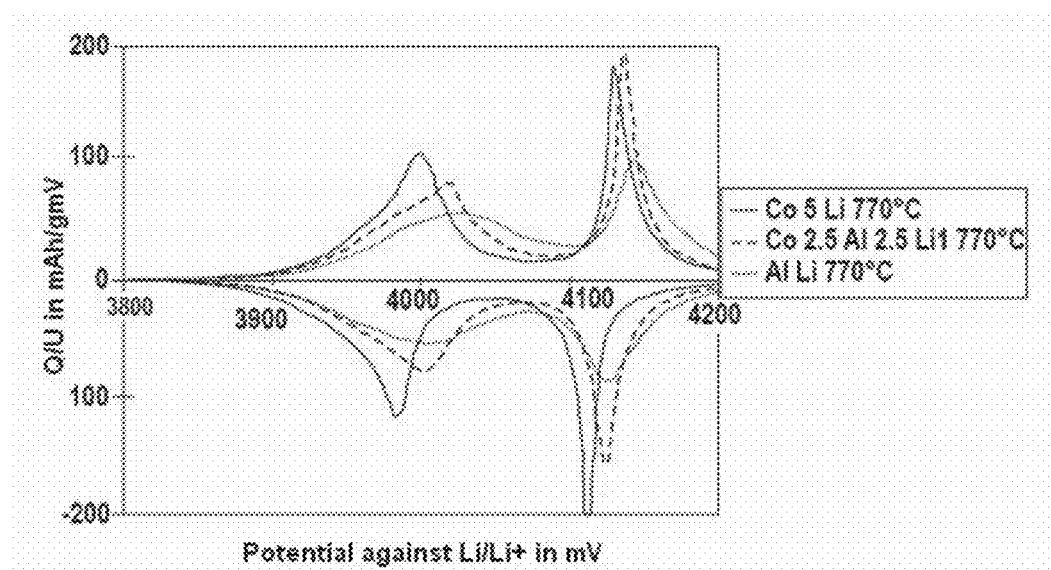
FIG. 1: dQ/dE plotted against E for various Co/Al/Li levels of lithium manganese spinels

Analysis Methods:

In the following examples, the following analysis methods were used and implemented in accordance with the following instructions:

a) Laser granulometry with a Malvern device
b) BET surface area according to DIN 66132
c) Cerimetry (based on U. R. Kunze, Grundlagen der quantitativen Analyse, page 207, $2^{nd}$ edition, Thieme Verlag, Stuttgart 1986). Initially, the $MnO_2$, obtained from a sample of the mixed oxide by e.g. acid decomposition, with a defined excess of Mohr's salt was reacted in acidic solution and the $Fe^{2+}$ that was not consumed was back titrated with $Cer^{(IV)}$ sulphate, whereupon the quantity of $MnO_2$ and therefore the analytical content of the sample, consequently the average degree of oxidation, can be determined via difference calculation.

d) XRD measurement

Apertures (1 mm/1 mm/0.2 mm); radiation: CuK α☐☐range: 10-80°; increment: 0.02°; measurement period: 5.5 sec/step

EXPERIMENTAL

The starting products used are commercially available from the following suppliers and, unless otherwise indicated, were used as received.
Manganese carbonate ($MnCO_3$) S grade: Comilog/Erachem
Lithium hydroxide monohydrate ($LiOH*H_2O$): Acu Pharma
Boric acid ($H_3BO_3$): Jäkle Chemie
Aluminium nitrate nonahydrate ($Al(NO_3)_3*9H_2O$): Tropitzsch
Zinc nitrate hexahydrate ($Zn(NO_3)_2*6H_2O$): Plato
Manganese nitrate solution (50% by weight): Coremax/Taiwan Electrodes were prepared by mixing 70% active material or mixed oxide according to the invention, 20% Super P—Li conductive carbon from Timcal and 10% PTFE powder in a mortar until a floc formed. The floc was kneaded several times in the mortar before it was rolled out to a thickness of 100 μm in a stainless steel roller press. Round electrode films with a diameter of 10 mm were punched out, dried overnight at 200° C. and then arranged in a Swagelok PVDF T-cell for electrochemical measurements. The counter and reference electrodes consisted of a lithium metal film and were separated by a glass wool separator film from Whatman. Merck LP30 was used as electrolyte. The charge/discharge/test cycles were recorded at a current of C/20 and a nominal specific capacity of 120 mA/h in a voltage window between 4.2 volts and 2.8 volts.

Comparison Example 1

Preparation of a Lithium Manganese Spinel of the Formula Composition $Li[Mn_{1.87}Al_{0.10}Li_{0.03}]_2O_4$ with No Added Boron-Oxygen Compound.

The following components were provided as starting materials:

| | | |
|---|---|---|
| $MnCO_3$ | 93% | 231.13 g |
| $Al(NO_3)_3*9H_2O$ | 98.50% | 38.08 g |
| $HNO_3$ | 65% | 70.77 g |
| $LiOH*H_2O$ | 96.30% | 44.88 g |
| $H_2O$ | 100% | 230 g |

The manganese carbonate and the aluminium nitrate nonahydrate are stirred into or dissolved in small stages in the previously introduced water with a laboratory anchor stirrer. The nitric acid is then added slowly and stirring continued for 10 min. The nitric acid is measured such that approx. ¼ of the manganese carbonate dissolves as manganese nitrate. The laboratory anchor stirrer is set to 40 rpm in order to keep the suspension floating. The powdery lithium hydroxide monohydrate is then added and the laboratory anchor stirrer set to 100 rpm for 30 min. in order to compensate for the markedly increasing viscosity. The medium-brown paste obtained is dried in the laboratory dish at 100° C. for 18 h (amount weighed in 1431 g/amount weighed out 261 g) and the brown drying product comminuted in the hand mortar. 51.1 g of the drying product was calcined in air in the ceramic crucible at 500° C. for 1 h in the chamber furnace and 32.5 g of a black powder obtained. 9.0 g of the calcination product was sintered in air in the ceramic crucible in the chamber furnace at 750° C. for 12 h, with a heating time of 6 h and a cooling time likewise of 6 h. 8.85 g of sintered product was obtained.

Comparison Example 2

Preparation of an Aluminium- or Cobalt-Doped Lithium Manganese Spinel with Lithium Hyperstoichiometry.

The samples are prepared by separately introducing manganese nitrate and dopant solutions (aluminium and/or cobalt nitrate) into a receiver solution of LiOH and $NH_3$. The samples are transferred into a furnace without a washing process and predried statically at 160° C. A pre-tempering of the precursor at 500° C. follows. After cooling, the intermediate product is pestled and transformed into the finished end-product in a second tempering step at different final temperatures (690° C., 730° C. and 770° C.)

Compared with the cobalt-doped product, the crystallite size of the aluminium-doped spinels is clearly smaller.

A more pronounced markedness of the additional stages and lower cycle stability in the examined cycle range were shown in the case of the electrochemical behaviour of the spinels containing Co/Li. Higher cycle stability was found in the case of the Al/Li-doped sample.

Spinels with different Li/Mn/Co/Al contents were synthesized. Table 1 shows the prepared spinels:

TABLE 1

| Effect of the dopants (doping elements) Al, Co and Li; the quoted values correspond to the portions of replaced Mn ions in % | | | |
|---|---|---|---|
| Sample | Al | Co | Li |
| G1007 | 0 | 5 | 1.5 |
| G1008 | 0 | 5 | 1.5 |
| G1010 | 5 | 0 | 1.5 |
| G1011 | 5 | 0 | 1.5 |
| G1019 | 0 | 5 | 0 |
| G1020 | 5 | 0 | 0 |
| G1021 | 0 | 5 | 1 |
| G1022 | 5 | 0 | 1 |
| G1028 | 2.5 | 2.5 | 1 |

The obtained spinels were firstly characterized electrochemically:

Important information about inter alia the cycle stability can be found in the course of the potential of the charge/discharge curves. Typically, after approximately half charge/discharge, the charge and discharge curves show a potential step which is attributable to structural order effects in the spinel lattice. The more pronounced and sharper this jump is, the poorer as a rule the cycle stability of the tested material. This effect already gives an advance indication of the cycle stability of the material.

The same applies for an additional potential step which can occur at 3.1 V vs. Li.

The differentials of the potential curves (dQ/dE vs. E) were plotted (FIG. 1) in order to be able to better compare the markedness of the potential steps. The maxima/minima correspond to the plateaus in the charge curves. The sharper the peaks here, the more pronounced the markedness of the steps is.

FIG. 1 shows that the peaks merge more markedly as the aluminium content in the structure increases, which corresponds to a "blurring" of the potential curves. This effect is a criterion for the structural insertion of the aluminium in the spinel structure. Electrochemically, a higher cycle stability thus results.

Alongside this, an increase in potential was also established by exchanging cobalt with aluminium.

The consequence of the additional insertion of hyperstoichiometric lithium (in manganese lattice sites) in the aluminium-doped sample is an even more pronounced overlapping of the peaks. No shift of the peak position is to be seen.

Example 1

Preparation of a Mixed Oxide According to the Invention

The mixed oxide according to the invention was prepared starting from a stoichiometric doped lithium manganese spinel (precursor value) obtained analogously to comparison example 1. To create the hyperstoichiometry, LiOH and, as boron-oxygen compound, boron oxide in the form of a mixture of LiOH and $B_2O_3$ were used. The molar ratio of Li to B was 2 to 1 or f=2.5).

Figure 3:
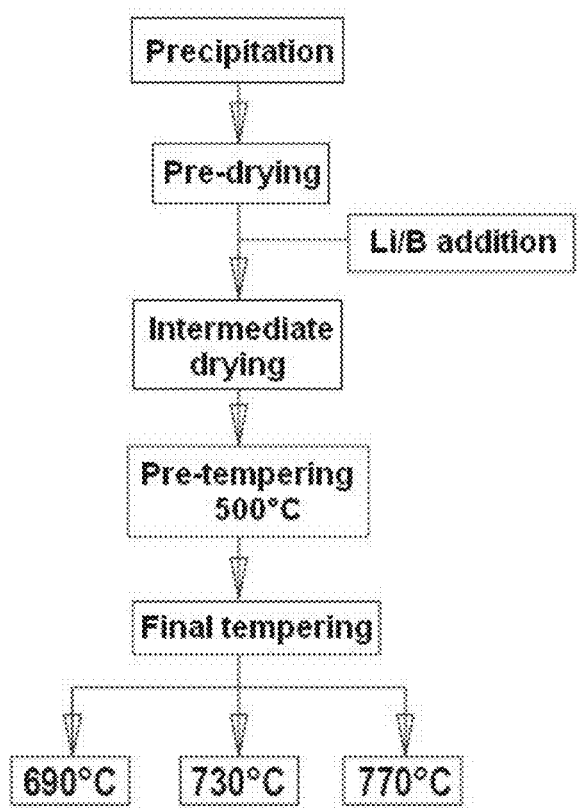
FIG. 3: the flowchart of the method according to the invention

The precursor (5% Al (d=0.1) and 1.5% Li (c=0.03) doping) was mixed with different portions of LiOH and $B_2O_3$ solutions and reacted according to the scheme in FIG. 3.

The addition of the boron-oxygen compound, here the borate, affects the morphology, the half-widths of the X-ray reflexes and the BET surface area of the Al/Li-doped lithium manganese spinels of the mixed oxide according to the invention.

Even a small addition of borate is already enough to achieve a pronounced jump in important properties.

Figure 4:
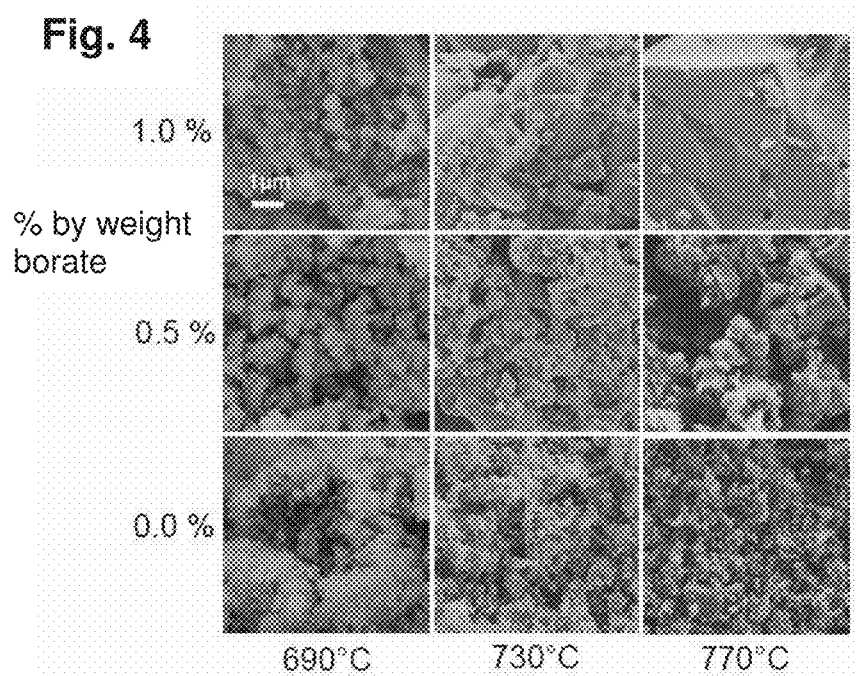
FIG. 4: SEM micrographs of mixed oxides according to the invention
Figure 5:
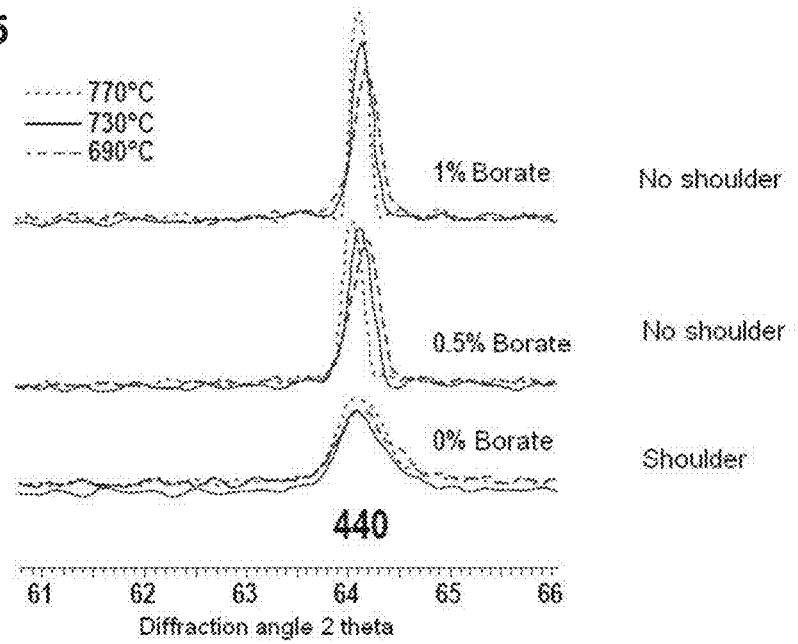
FIG. 5: position, reflex width and phase-purity of mixed oxides according to the invention

As can be seen in FIG. 4, the crystallite size increases markedly when borate is added and when the tempering temperature increases. The largest crystallites are accordingly achieved at a temperature of 770° C. and when adding 1% by weight (preferably based on the total mixture of the mixed oxide). However, the BET surface area and, as can be seen in FIG. 5, the half-width of the XRD reflexes clearly decrease.

The examined mixed oxides according to the invention were single-phase (homophase or homeotype) according to the profile of the XRD reflexes, i.e. a complete regular insertion of aluminium into the crystallite structure had taken place.

Example 2

XRD Spectrum of the Mixed Oxide According to the Invention

Figure 2:
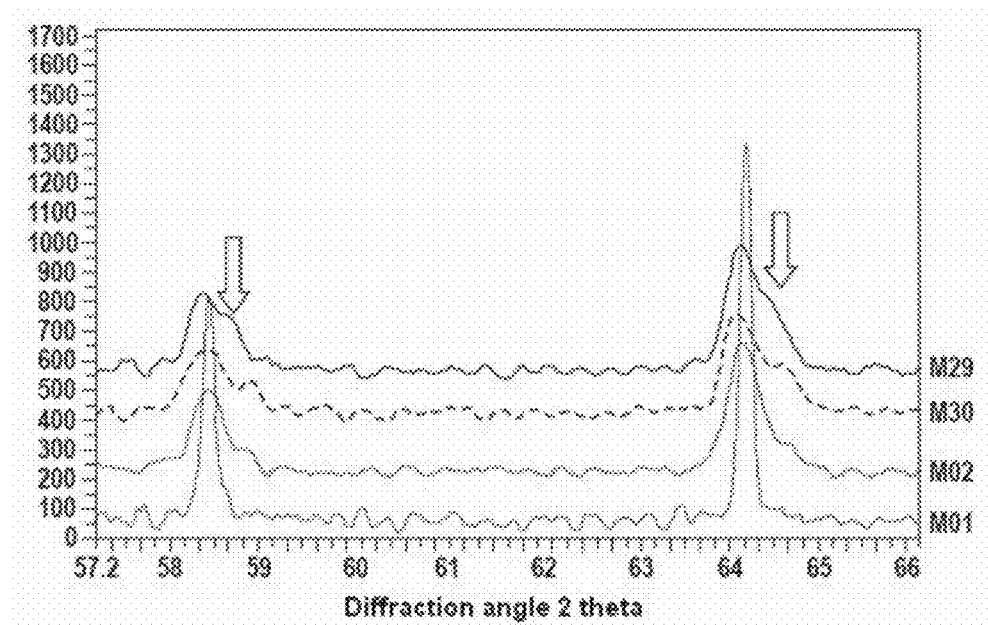
FIG. 2: comparison of XRD spectra of mixed oxides according to the invention and pure lithium manganese spinels

The XRD spectrum of the mixed oxide according to the invention (MO1 1% by weight borate and MO2 0.5% by weight borate), obtained according to Example 1, was compared with the XRD spectra of Al-doped hyperstoichiometric lithium manganese spinels obtainable according to comparison example 1 (M29 and M30) (FIG. 2).

All samples were doped with Li/Al in the ratio 1:5. The aim was to test the homogeneous insertion of the dopants into the crystal lattice.

In the XRD spectrum, a homogeneously doped single-phase lithium manganese spinel of the mixed oxide according to the invention shows individual "symmetrical" reflexes (MO1 and MO2) (after Kα2 correction).

The curves of M 29 and M 30 show clearly pronounced shoulders (arrows) (after Kα2 correction). This indicates a multiphase structure or an inhomogeneous distribution of the dopants.

Example 3

Electrochemistry

Figure 6:
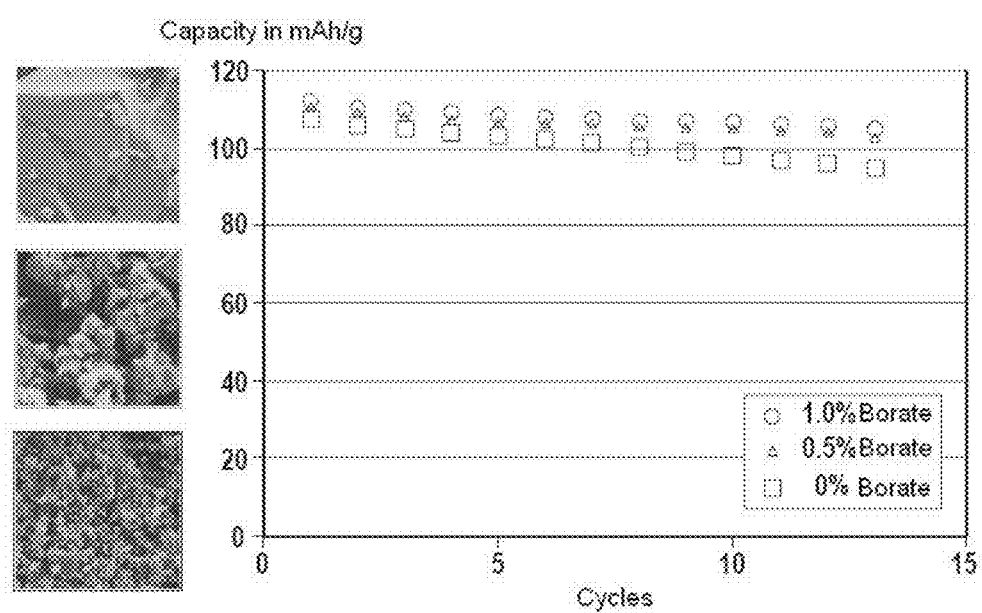
FIG. 6: the effect of the addition of borate on the electrochemical behaviour

The presence of a boron-oxygen compound, here the borate, in the mixed oxide according to the invention obtained according to Example 1 also has a positive electrochemical effect. The cycle stability increases, as can be seen in FIG. 6, as the level of borate in the mixed oxide increases compared with a pure Al-doped lithium manganese spinel.

Example 4

Manganese Solution

A reason for the previous lack of cycle stability of pure doped or non-doped lithium manganese spinels was their decomposition in electrolytes. In order to examine the relative stability of the mixed oxide according to the invention compared with a decomposition of the spinel component in an electrolyte, in each case 4 g of mixed oxide powder from Example 1 was stored for four weeks at 40° C. with different quantities of borate and an Al-doped lithium manganese spinel from Example 1 in 40 g of LP30 (Merck electrolyte). The electrolyte was then analysed for dissolved manganese by means of ICP. The powders tempered at 770° C. were tested.

Figure 7:
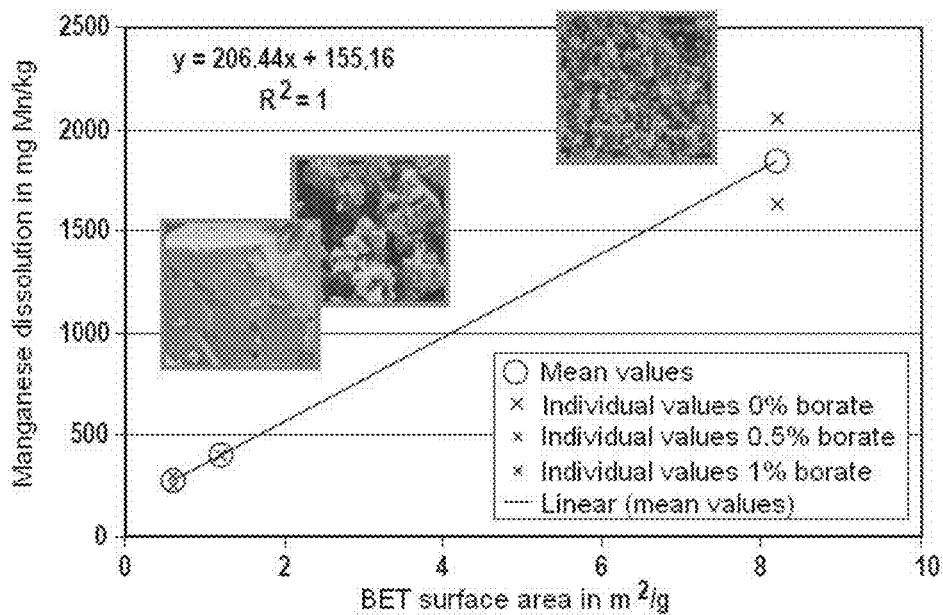
FIG. 7: the manganese dissolution of mixed oxides according to the invention compared with pure lithium manganese spinels in mg Mn/kg

As can be seen in FIG. 7, the examined samples showed, in the relative comparison, a decrease in the manganese dissolution as the BET surface area increased. It can be seen that a pure lithium manganese spinel without the added boron-oxygen compound shows the highest dissolution. The addition of the boron-oxygen compound thus stabilizes the lithium manganese spinel in the mixed oxide according to the invention.

Example 5

Variation of the Lithium Hyperstoichiometry

In further syntheses, the lithium hyperstoichiometry of the spinel component of the mixed oxide was varied progressively with a constant Al content.

Chosen dopings were Al 5% Li 1% (d=0.1; c=0.02), Al 5% Li 2% (d=0.1; c=0.04) and Al 5% Li 2.5% (d=0.1; c=0.05). Each of the samples was first calcined at 500° C. with and without 1% by weight of an LiOH/$B_2O_3$ mixture (b=0.002; f=2.5) as described and then tempered at 690° C., 730° C. and 770° C.

For the mixed oxides according to the invention, a clear relationship between reflex half-widths and lithium hyperstoichiometry was able to be recorded. As the lithium hyperstoichiometry increased, the reflexes narrowed.

Figure 8:
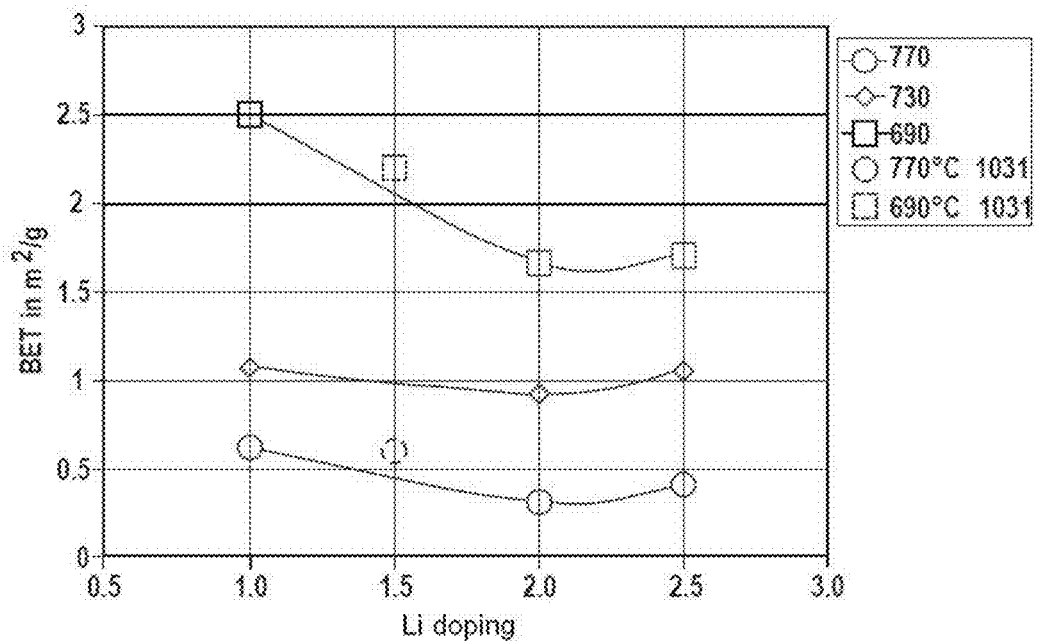
FIG. 8: the relationship between the BET surface area of mixed oxide crystals according to the invention and temperature and lithium hyperstoichiometry

The BET surface area was then correlated with the lithium hyperstoichiometry:

Due to the influence of the borate, there was a "levelling" of the scatterings of the reflex half-widths depending on the lithium hyperstoichiometry which occurred in samples from different syntheses (see FIG. 2). The same phenomenon was observed when measuring the BET surface area of the samples. Here too, a levelling was to be recorded in the presence of borate (FIG. 8).

The BET values for the samples from the variation of the lithium hyperstoichiometry are summarized in Table 2.

TABLE 2

BET surface area: Li-hyperstoichiometry variation

| Sample | BET m²/g | T ° C. | Li (mol % on Mn) |
|---|---|---|---|
| G1051B1 | 0.62 | 770 | 1.0 |
| G1051B1 | 1.07 | 730 | 1.0 |
| G1051B1 | 2.5 | 690 | 1.0 |
| G1031B2 | 0.6 | 770 | 1.5 |
| G1031B2 | 2.2 | 690 | 1.5 |
| G1052 | 4.91 | 770 | 2.0 |

TABLE 2-continued

BET surface area: Li-hyperstoichiometry variation

| Sample | BET m²/g | T ° C. | Li (mol % on Mn) |
|---|---|---|---|
| G1052B1 | 0.31 | 770 | 2.0 |
| G1052B1 | 0.92 | 730 | 2.0 |
| G1052B1 | 1.66 | 690 | 2.0 |
| G1053 | 4.85 | 770 | 2.5 |
| G1053B1 | 0.4 | 770 | 2.5 |
| G1053B1 | 1.04 | 730 | 2.5 |
| G1053B1 | 1.7 | 690 | 2.5 |

Overall, as well as the addition of borate and the temperature, the lithium hyperstoichiometry also affects the BET surface area. BET values <1 m²/g were found.

Example 6

Cerimetry

The fact that hyperstoichiometric lithium is inserted into the spinel lattice was demonstrated by means of cerimetry using a mixed oxide according to the invention with aluminium-doped manganese spinel. The insertion into the spinel lattice changes the average degree of oxidation of the manganese ions. Were the lithium present only as fluxing agent (in the form of $Li_2O$), the average degree of manganese ion oxidation would be +3.56, in the case of a structural insertion, +3.62.

The two structural borderline cases can be represented as follows:

| Pure fluxing agent | |
|---|---|
| $Li_1[Li^{+1}_{0.029}Al^{+3}_{0.098}Mn^{+x}_{1.874}]O_4 Mn^{+3.56}$ | $0.071\ Li_2O^*wB_2O_3$ |

| Structural lithium insertion | |
|---|---|
| $Li_1[Li^{+1}_{0.067}Al^{+3}_{0.094}Mn^{+x}_{1.839}]O_4 Mn^{+3.62}$ | $wB_2O_3$ |

The obtained values which are listed in Table 3 lay in the range from +3.59 to +3.69, which proves the structural insertion.

TABLE 3

Average degree of oxidation, measured by means of cerimetry, of the manganese ions in the mixed oxide $Li[LiAlMn]O_4 \bullet B_2O_3$.

| Sample | | | Temp. ° C. | Stoichiometry | | | | $M^{X+}$ cerimetric | STDDEV +/− |
|---|---|---|---|---|---|---|---|---|---|
| | | | | Li | Li | Al | Mn | | |
| G1031 | B2 | | 500 | 1 | 0.081 | 0.095 | 1.824 | 3.69 | 0.04 |
| G1031 | B2 | T1 | 700 | 1 | 0.067 | 0.094 | 1.839 | 3.59 | 0.01 |
| G1031 | B2 | T2 | 730 | 1 | 0.070 | 0.095 | 1.835 | 3.63 | 0.01 |
| G1031 | B2 | T3 | 690 | 1 | 0.071 | 0.094 | 1.835 | 3.59 | 0.01 |
| G1051 | B1 | T2 | 730 | 1 | 0.076 | 0.092 | 1.832 | 3.60 | 0.01 |
| G1053 | | T1 | 770 | 1 | 0.055 | 0.094 | 1.851 | 3.63 | 0.01 |
| G1053 | B1 | T1 | 770 | 1 | 0.100 | 0.093 | 1.807 | 3.62 | 0.02 |
| G1053 | | T2 | 730 | 1 | 0.053 | 0.093 | 1.854 | 3.59 | 0.00 |
| G1053 | B1 | T2 | 730 | 1 | 0.097 | 0.092 | 1.811 | 3.60 | 0.01 |

The degree of oxidation achieved depends on the synthesis temperature. At higher temperatures, the degree of oxidation was somewhat lower. This finding correlates well with the above-described structural temperature-related shift of the reflex layers in the XRD spectrum.

Figure 9:
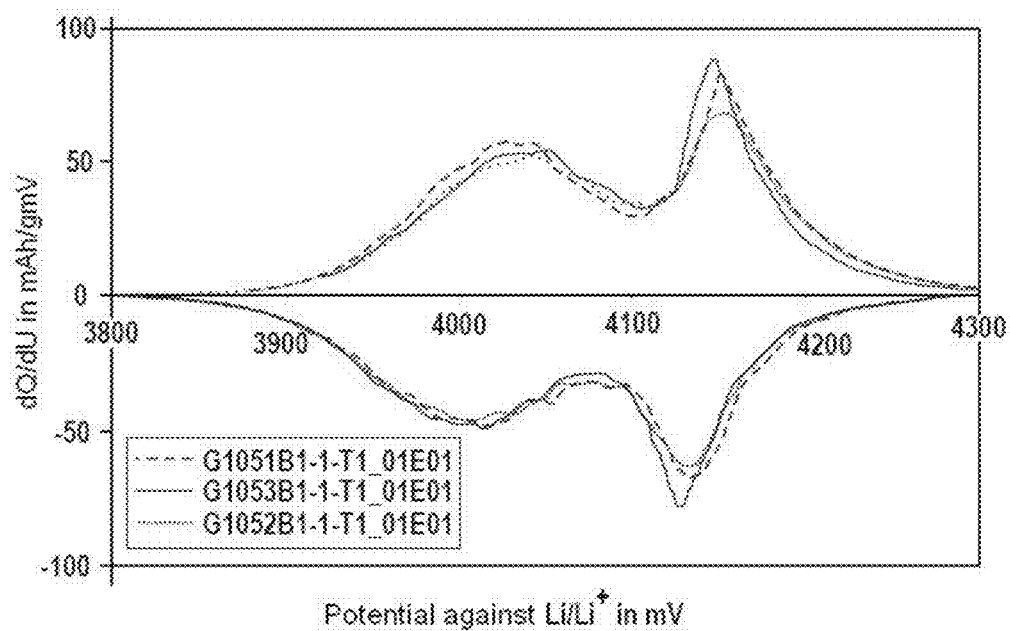
FIG. 9: dQ/dE plotted against E for mixed oxides according to the invention with different lithium hyperstoichiometry

In FIG. 9, dQ/dE vs. E of materials of different mixed oxides according to the invention with different lithium hyperstoichiometries are plotted.

Example 7

Electrochemical Examination

Figure 10:
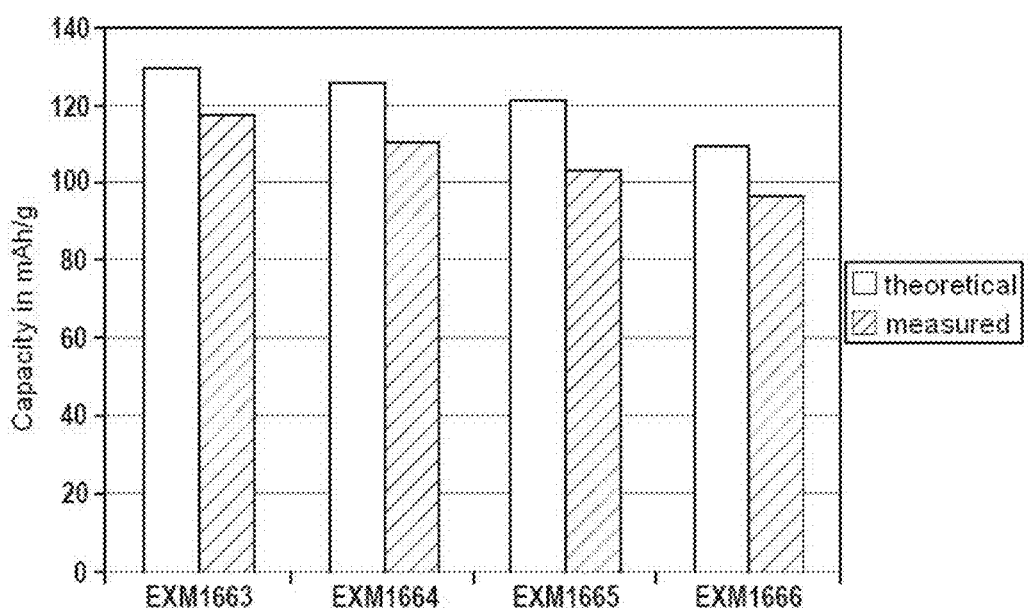
FIG. 10: the discharge capacities of mixed crystals according to the invention in the first cycle

FIG. 10 compares the discharge capacities of samples of mixed oxides according to the invention in the first cycle. The theoretical value was calculated from the analytically determined spinel stoichiometry. The measured values lie between 117 mAh/g for a purely lithium-doped (hyperstoichiometric) sample (EXM 1666) and 96 mAh/g for one doped with Li/Al/Zn.

The theoretical maximum capacity decreases from 129 mAh/g for EXM 1663 to 109 mAh/g for EXM1666. The measured values show the same tendency at a lower level.

The reference samples showed comparatively small capacities, which can be attributed to the increased lithium insertion.

Figure 11:
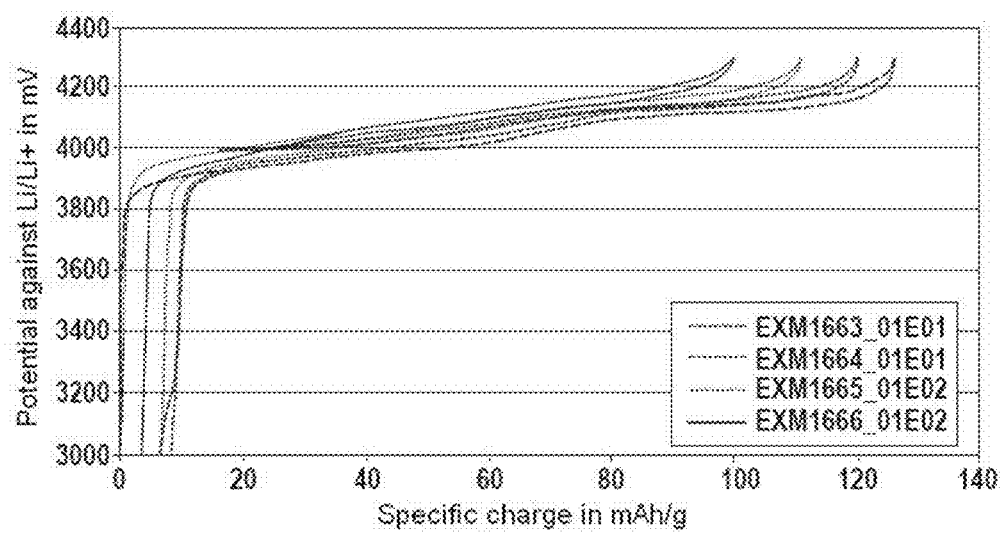
FIG. 11: the course of the potential in the first complete cycle of mixed oxides according to the invention
Figure 12A:
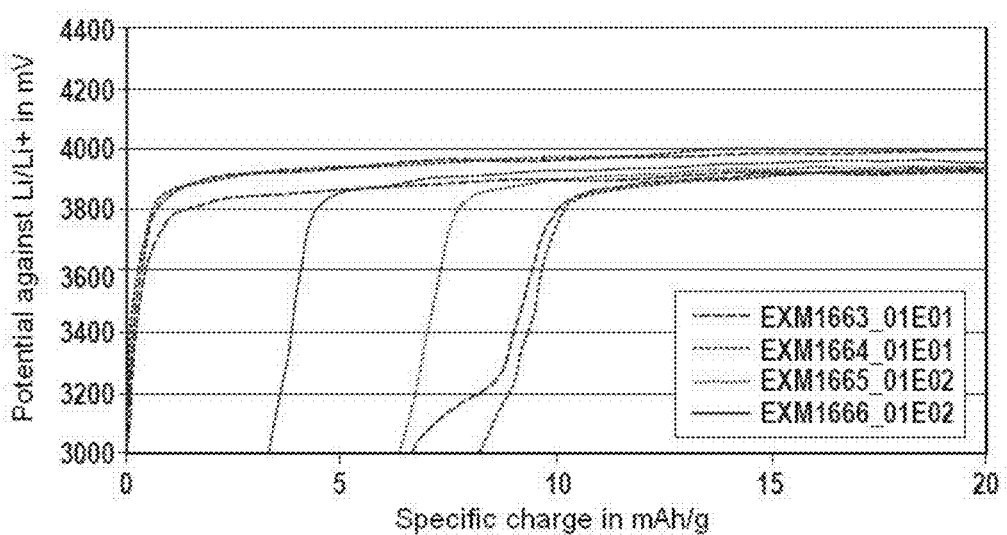
FIGS. 12a and 12b: the course of the potential in the first complete cycle of further mixed oxides according to the invention
Figure 12B:
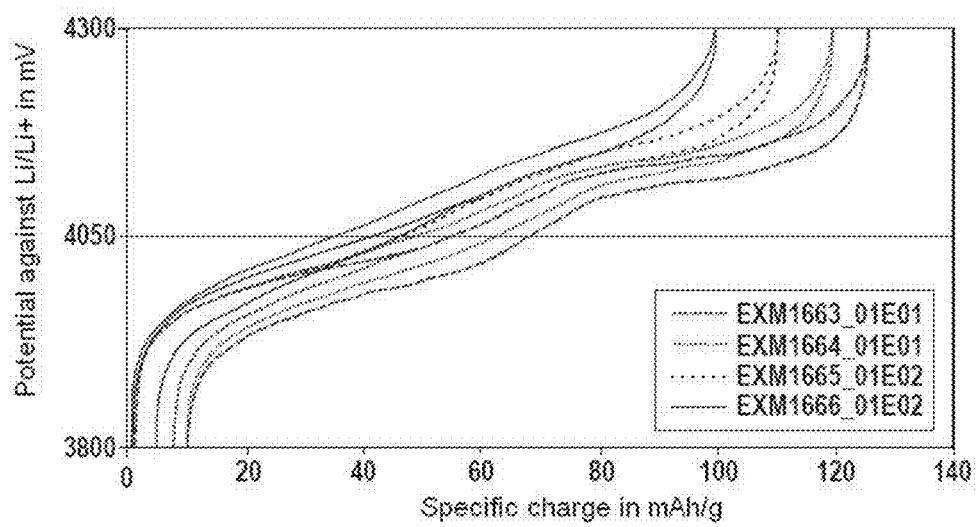

FIG. 11 shows in the overview the courses of the potential of the reference samples in the first complete cycle. In FIGS. 12*a* and 12*b*, the emphasis is on potential ranges which gave initial indications of the cycle behaviour of the samples. Both the occurrence of an additional potential step at 3.2 V and a well-pronounced step at half charge/discharge are considered a feature of poor cycle stability:

The potential plateau at 3.2 V (FIG. 12a, left-hand side) is clearly pronounced for the Al-free sample, still difficult to spot for the sample doped with 3% Al and no longer present in the models doped with 5% Al.

The markedness of the stage of potential at half charge/discharge decreases in the order EXM1663 after EXM1666.

Example 8

Industrial-Scale Preparation of a Mixed Oxide Containing Lithium Manganese Spinel According to the Invention of the Composition Formula $(Li_{0.99}Zn_{0.01})[Mn_{1.87}Al_{0.1}Li_{0.03}]O_4 \cdot (0.9\ B_2O_3, 2*0.9\ Li_2O)$ In each of several stirring mixtures, the following quantities of raw materials were used:

| | | |
|---|---|---|
| MnCO$_3$ | 4.360 kg | 93.50% |
| Mn(NO$_3$)$_2$ sol. | 2.843 kg | 50% |
| Al(NO$_3$)$_3$ * 9H$_2$O | 0.867 kg | 101% |
| Zn(NO$_3$)$_2$ * 6H$_2$O | 70.2 g | 99% |
| H$_2$O (dist.) | 3.530 kg | |
| LiOH * H$_2$O | 1.063 kg | 55% |
| Boric acid | 12.80 g | 100.3% |

The water, the manganese nitrate solution, the aluminium nitrate nonahydrate and the zinc nitrate hexahydrate were each placed in a 12l plastic bucket and mixed with a Pendraulik stirrer with stirring disk and dissolved completely. The finely-powdered boric acid and the manganese carbonate pre-ground to a D95 value of 27 μm were then added. The Pendraulik stirrer was first set to level 3 in order to keep the still highly liquid suspension homogeneous. The powdery lithium hydroxide was then added within 1 min. and stirred at level 4 for a further 15-20 min. The viscosity of the suspension increased rapidly.

The stirring mixtures were combined in a stirred receiver container and the still pumpable suspension was dried in a Storck Bowen spray drier with two-fluid nozzle and spraying from above in the cocurrent process at an air-entry temperature of 550° C. and an air-exit temperature between 140° C. and 145° C. A brown powder with a bulk density of 1011 g/l was obtained.

The drying product obtained in this way still contains nitrates and was calcined on stainless steel tray sheets in a continuous belt furnace with an attached exhaust-gas cleaning unit for nitrous vitriol gases at 450° C. and an average residence time of 1 h in the heating zone. Surprisingly, small quantities of nitrous vitriol gases formed and a fine black powder with a bulk density of 823 g/l was obtained. The calcination product was then tempered in air in an Alsint-ceramic crucible in the chamber furnace at 770° C. for 12 h with a heating time of 6 h and a cooling time of 12 h.

The bluish black tempering product was ground on an Alpine AFG100 air separator mill with ceramic separator wheel and ceramic milling air nozzles 3.0 mm in diameter at a separator speed of 5500 rpm.

Figure 13:
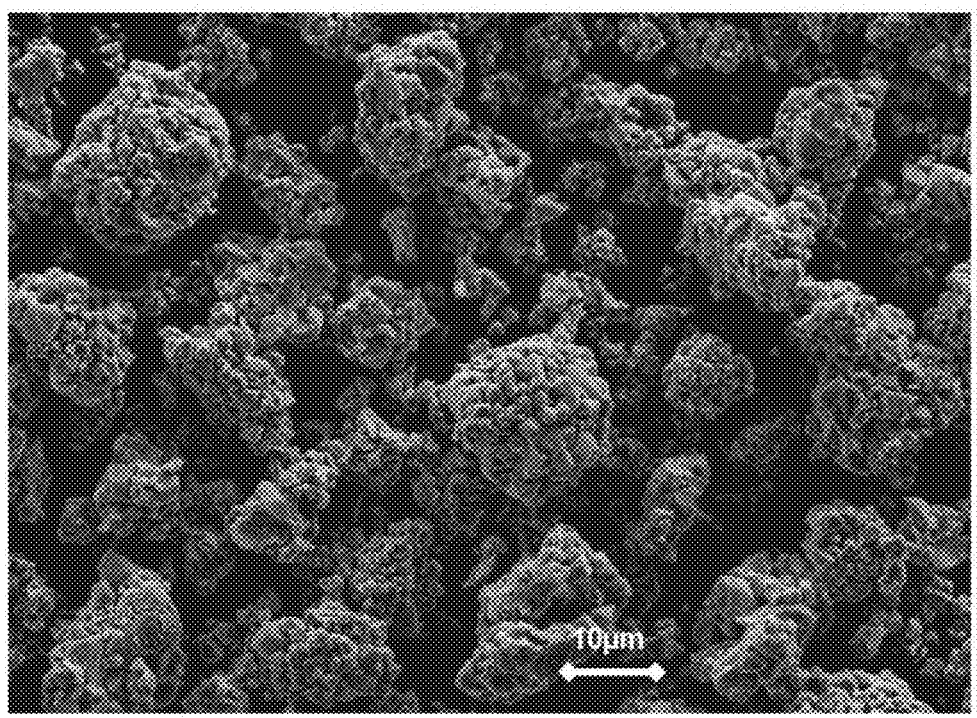
FIG. 13: a scanning electron micrograph of a mixed oxide according to the invention containing lithium manganese spinel.

The milled product collected in the centrifugal cyclone separator had a bulk density of 1045 g/l and an apparent density of 1713 g/l. FIG. 13 shows a scanning electron micrograph of the product. The chemical composition determined by means of ICP was:

| | |
|---|---|
| Li | 3.9% |
| Mn | 59.7% |
| Al | 1.6% |

-continued

| | |
|---|---|
| Zn | 3800 mg/kg |
| B | 600 mg/kg |
| S | 0.23% |
| Na | 920 mg/kg |

The particle-size distribution was monomodal and characterized by the following parameters:
$D_{10}$=2.5 μm
$D_{50}$=10.8 μm
$D_{90}$=20.7 μm
$D_{100}$=35.6 μm Further product properties were:
pH value: 9.5
residual moisture content: 0.26% by weight
(Karl-Fischer method)
BET surface area: <1 m$^2$/g
micropore volume: <0.001 cm$^3$/g
(ASAP 2010, Micromeritics)
cubic lattice constant a=8.210 (according to X-ray diffraction)

In the electrochemical cycle test, the mixed oxide containing lithium manganese spinel according to the invention shows a discharge capacity of 105 mAh/g and a cycle loss of less than 0.1% per cycle measured in a half-cell of the LMS//LiPF6-EC-DMC//Li type.

What is claimed is:

1. A mixed oxide containing
   a) a mixed-substituted lithium manganese spinel as a first constituent in which a first portion of the manganese lattice sites are occupied by lithium ions and
   b) a boron-oxygen compound as a second constituent,
   wherein the mixed oxide is a single-phase homeotype mixed crystal comprising the constituents a) and b), wherein the second constituent is in the same phase as the first constituent, and
   wherein the mixed oxide has a composition satisfied by the following formula:

$[(Li_{1-a}M_a)(Mn_{2-c-d}Li_cG_d)O_x] \cdot (bB_2O_3, f*bLi_2O)$ wherein:
   0≤a<0.1;
   d<1.2;
   3.5<x<4.5;
   0.01<c<0.06;
   0<b<0.05;
   1<f<4;
   M is at least one element selected from the group of Zn, Mg and Cu; and
   G is at least one element selected from the group of Al, Mg, Zn, Co, Ni, Cu and Cr; and
   wherein in the mixed-substituted lithium manganese spinel an element of G occupying a second portion of the manganese lattice sites is Ni or Co, wherein when Ni is present, the contribution of Ni to "d" is 0.5+/−0.1 or when Co is present, the contribution of Co to "d" is 1+/−0.2, and
   the size of the primary crystallites of the mixed oxide, measured as $D_{50}$, is at least 0.5 μm.

2. A mixed oxide according to claim 1, wherein the value for "b" is between 0.01 and 0.05.

3. A mixed oxide according to claim 1, wherein the value for "b" is between 0.0025 and 0.025.

4. A mixed oxide according to claim 1, wherein the value for "b" is between 0.0025 and 0.005.

5. The mixed oxide according to claim 1, wherein in the mixed-substituted lithium manganese spinel manganese lattice sites are occupied by a metal ion G selected from the group consisting of Al, Mg, Zn, Cu and Cr.

6. The mixed oxide according to claim 5, wherein some of the lithium ions on the 8a tetrahedral sites are substituted by a metal ion M selected from the group consisting of Zn, Mg and Cu.

7. The mixed oxide according to claim 1, wherein the X-ray diffractogram of the mixed oxide has a signal at a diffraction angle 2θ in the range from 63.5 to 65°, in which a ratio of a line widths $B_{10}$ measured at 10% of the signal height to a line width $B_{50}$ measured at 50% of the signal height is less than 2.0.

8. The mixed oxide according to claim 7, wherein the ratio is less than 1.8.

9. The mixed oxide according to claim 7 with a BET surface area of less than 4 $m^2/g$.

10. The mixed oxide according to claim 1, wherein the size is greater than 1 μm.

11. An electrode for a secondary battery, comprising an electrically conductive support to which the mixed oxide according to claim 1 is applied.

12. A secondary battery with the electrode according to claim 11.

13. A process for the preparation of a mixed oxide containing a mixed-doped hyperstoichiometric lithium manganese spinel, wherein
at least one lithium component, at least one manganese component, at least one boron component, at least one component containing G, wherein G is selected from the group of Al, Mg, Co, Ni, Cu and Cr, and optionally at least one component containing M, wherein M is selected from Zn, Mg and Cu is provided;
a first portion of a solid mixture is prepared by mixing the manganese component and the lithium component optionally with one or more of the components other than the manganese, lithium and boron components in dry, powdery form;
a second portion of a liquid mixture is prepared which contains the boron component in dissolved form and/or as a suspension, wherein the stoichiometric quantities of the components of the first and second portions are selected in such a way that the mixed oxide of the following formula results:

wherein:
0≤a<0.1;
d<1.2;
3.5<x<4.5;
0.01<c<0.06;
0<b<0.05;
1<f<4;

M is at least one element from the group of Zn, Mg and Cu;
G is at least one element from the group of Al, Mg, Co, Ni, Cu and Cr;
the first and second portions of the mixture are mixed;
a solvent is drawn off from the mixture obtained; and
the mixture is calcined at a temperature of 300° C. or more;
wherein the size of the primary crystallites of the mixed oxide, measured as $d_{50}$, is at least 0.5 μm.

14. A process according to claim 13, wherein in the mixed oxide the value for "b" is between 0.01 and 0.05.

15. A process according to claim 13, wherein in the mixed oxide in the value for "b" is between 0.0025 and 0.025.

16. A process according to claim 13, wherein in the mixed oxide the value for "b" is between 0.0025 and 0.005.

17. The process according to claim 13, wherein the calcining is carried out in at least two steps, wherein calcination is at temperatures of 300 to 600° C. in a first step and at temperatures of 600 to 900° C. in a second step.

18. The process according to claim 13, wherein the first portion has a $D_{50}$ value of less than 30 μm.

19. The process according to claim 13, wherein before mixing the manganese component and the lithium component optionally with one or more of the components other than the manganese, lithium and boron components in dry, powdery form, the manganese component is ground so finely that a $D_{95}$ value measured by laser granulometry of less than 30 μm is set.

20. The process according to claim 13, wherein water is used as the solvent for the preparation of the second portion of the mixture.

21. The process according to claim 20, wherein the second portion of the mixture contains a portion of the manganese component and of component G, or of the manganese component or of component G.

22. The process according to claim 21, wherein the first portion of the mixture is stirred into the second portion of the mixture.

23. The process according to claim 13, wherein the at least one lithium component, at least one manganese component, at least one boron component, at least one component containing G, wherein G is selected from the group of Al, Mg, Co, Ni, Cu and Cr, and optionally at least one component containing M, wherein M is selected from Zn, Mg and Cu are provided in the form of one or more of their nitrates, acetates, oxides, hydroxides and carbonates.

24. The process according to claim 13, wherein the manganese component is selected from manganese carbonate, manganese oxide and manganese dioxide.

25. The process according to claim 13, in which G is selected from Al and Mg, and M is selected from Zn.

* * * * *